United States Patent
Epstein et al.

[11] Patent Number: 6,144,200
[45] Date of Patent: Nov. 7, 2000

[54] ACQUISITION OF SEGMENTED MRI CARDIAC DATA USING AN EPI PULSE SEQUENCE

[75] Inventors: Frederick H. Epstein, Gaithersburg, Md.; Steven D. Wolff, New York, N.Y.

[73] Assignee: General Electric Company, Milwaukee, Wis.

[21] Appl. No.: 09/027,519

[22] Filed: Feb. 20, 1998

[51] Int. Cl.[7] .................................................. G01V 3/00
[52] U.S. Cl. ............................................ 324/306; 324/307
[58] Field of Search ...................... 324/307, 309, 324/306, 314, 312

[56] References Cited

U.S. PATENT DOCUMENTS

| | | | |
|---|---|---|---|
| 4,710,717 | 12/1987 | Pelc et al. ................................ | 324/309 |
| 4,952,877 | 8/1990 | Stormont et al. ....................... | 324/312 |
| 4,992,736 | 2/1991 | Stormont et al. ....................... | 324/309 |
| 5,377,680 | 1/1995 | Bernstein et al. ................... | 128/653.2 |
| 5,429,134 | 7/1995 | Foo ........................................ | 324/307 |
| 5,545,992 | 8/1996 | Foo ........................................ | 324/309 |
| 5,781,010 | 7/1998 | Kawasaki et al. ...................... | 324/309 |

Primary Examiner—Louis Arana
Attorney, Agent, or Firm—Quarles & Brady; Christian G. Cabou; Phyllis Y. Price

[57] ABSTRACT

A method is disclosed to reconstruct multiphase MR images that accurately depict the entire cardiac cycle. A segmented, echo-planar imaging (EPI) pulse sequence is used to acquire data continuously during each cardiac cycle. Images are retrospectively reconstructed by selecting views from each heartbeat based on cardiac phase.

11 Claims, 3 Drawing Sheets

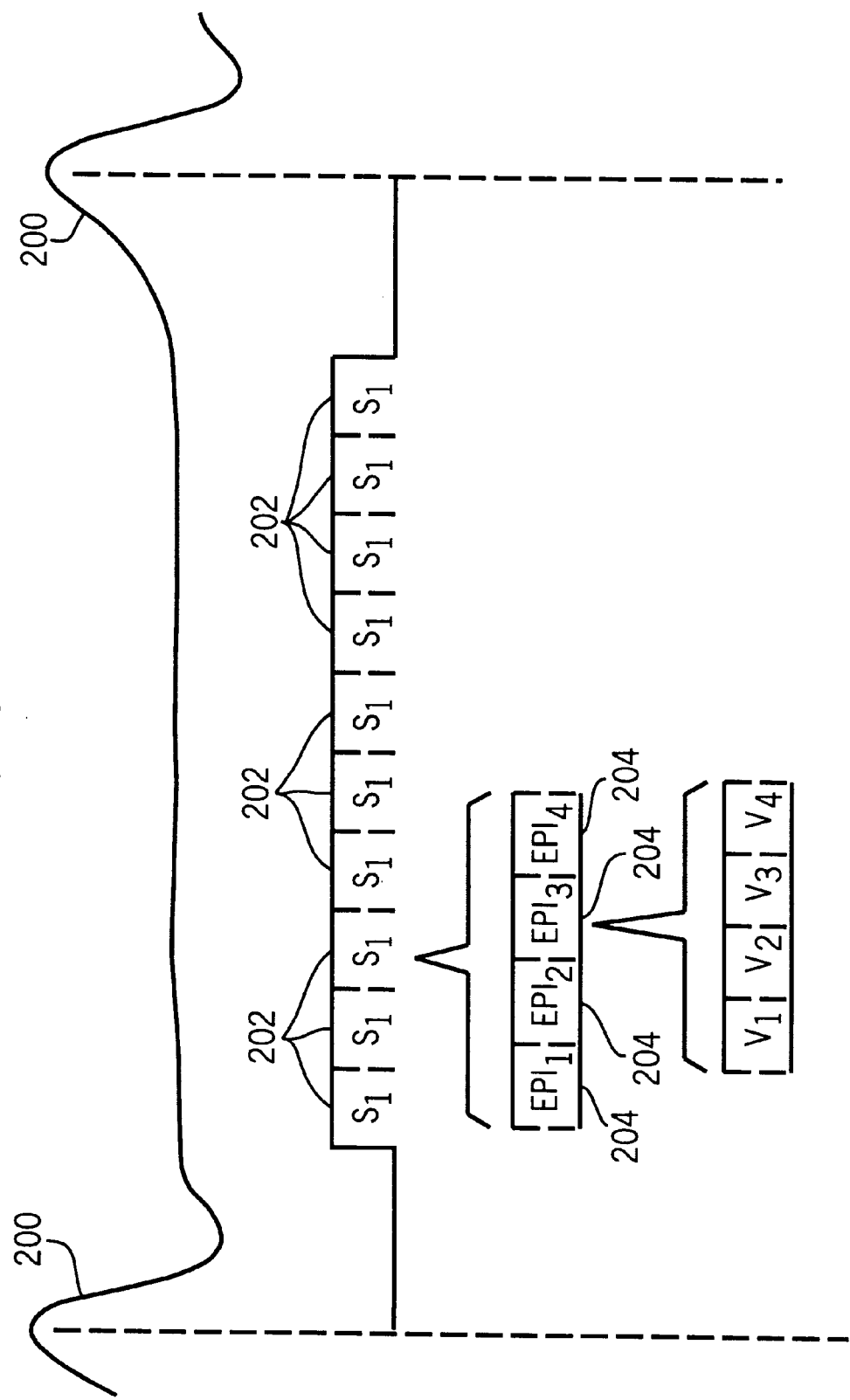

ACQUISITION OF SEGMENTED MRI CARDIAC DATA USING AN EPI PULSE SEQUENCE

BACKGROUND OF THE INVENTION

The field of the invention is nuclear magnetic resonance imaging methods and systems. More particularly, the invention relates to the production of images in a fast cardiac MRI acquisition.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Most NMR scans currently used to produce medical images require many minutes to acquire the necessary data. The reduction of this scan time is an important consideration, since reduced scan time increases patient throughput, improves patient comfort, improves image quality by reducing motion artifacts, and enables the performance of medical test procedures such as timed pharmacological stress tests (e.g. multi-stage dobutamine stress test). There is a class of pulse sequences which have a very short repetition time (TR) and result in complete scans which can be conducted in seconds rather than minutes. When applied to cardiac imaging, for example, a complete scan from which a series of images showing the heart at different phases of its cycle or at different slice locations can be acquired in a single breath-hold.

There are two common techniques for acquiring cardiac MR images. The first is a prospectively gated, single-phase, multi-slice conventional spin echo sequence. In each cardiac cycle, data at different spatial locations are acquired with the same k-space phase encoding value. Images at the different spatial locations are then acquired at different temporal phases of the cardiac cycle. Since only one k-space line is acquired per cardiac trigger, a typical scan with a 128 k-space views in the phase encoding direction will take 128 heart beats to complete. The sequence repetition time (TR) is then the cardiac R—R interval time.

A short TR gated gradient echo pulse sequence may be used to acquire (CINE) images at multiple time frames of the cardiac cycle. As described in U.S. Pat. No. 4,710,717, conventional CINE pulse sequences run asynchronously to the cardiac cycle with the phase encoding value stepped to a new value at each R-wave trigger. In CINE, each rf excitation pulse is applied at the same spatial location and repeated at intervals of TR in the cardiac cycle. Since the sequence runs asynchronously, the rf excitation pulses may occur at varying time delays from the R-wave from one cardiac cycle to the next. On detection of the next cardiac R-wave, the acquired data from the previous R—R interval are resorted and interpolated into evenly distributed time frames within the cardiac cycle. This method of gating is also known as retrospective gating as the data for the previous R—R interval is resorted only after the current R-wave trigger is detected.

As in gated spin echo, only one k-space phase encoding view is acquired per heart beat. The total image acquisition time is then on the order of 128 heart beats.

Faster scan times can be achieved by segmenting k-space and acquiring multiple phase encoding k-space views per R—R interval. The scan time is speeded up by a factor equal to that of the number of k-space views acquired per image per R—R interval. In this manner, a typical CINE acquisition with a matrix size of 128 pixels in the phase encoding direction can be completed in as little as 16 heart beats, when 8 k-space views per segment are acquired.

Multiple phases of the cardiac cycle can be visualized by repeated acquisition of the same k-space segment within each R—R interval but assigning the data acquired at different time points in the cardiac cycle to different cardiac phases. Thus, the cardiac cycle is sampled with a temporal resolution equal to the time needed to acquire data for a single segment, such that temporal resolution=$vps \times TR$, where vps is the number of k-space lines per segment, the TR is the pulse sequence repetition time. The total scan time is then $$\text{Scan time} = \frac{yres}{vps} \times R - R \text{ time}$$

where yres is the number of phase encoding views in the image. Typically, an image utilizes 128 or more phase encoding views, and 8 views per segment is also often used.

In segmented k-space scans, the total scan time can be substantially reduced by increasing the number of views per segment (vps). However, this is at the expense of reducing the image temporal resolution. As described in U.S. Pat. No. 5,377,680 the image temporal resolution can be increased by sharing views between adjacent time segments to generate images averaged over different time points. The true image temporal resolution is unchanged but the effective temporal resolution is now doubled. View sharing can thus increase the number of cardiac phase images reconstructed without affecting the manner in which the k-space data is acquired.

Prospectively gated, segmented k-space sequences have become popular for cardiac imaging mainly because images can be obtained in a breath-hold and therefore do not suffer from respiratory artifact. Images are formed by acquiring data over a series of heartbeats with data acquisition gated to the QRS complex of the ECG. The assessment of cardiac function is typically performed using an ECG-gated segmented k-space fast gradient echo (FGRE) pulse sequence. Using this approach, multi-phase images of the heart with approximately 40–80 ms temporal resolution are typically acquired in 10–25 seconds, usually during suspended respiration (breathholding). In each heartbeat a segment is played out repeatedly (at multiple cardiac phases), where each segment consists of $N_{vps}$ FGRE pulse sequence repetitions, where $N_{vps}$ is the number of views per segment. Within a segment, each FGRE pulse sequence repetition acquires one distinct line of data (a view), so that $N_{vps}$ different views are acquired per segment. If, for example, 128 views are required per image, and $N_{vps}$=8, and TR=10 ms, then 16 heartbeats (approximately 16 seconds) are needed to acquire a complete set of multi-phase cardiac images at each heart location, and the nominal temporal resolution of each image is 80 ms. In practice, typically 12–15 locations covering the entire heart in the short-axis orientation are scanned. Therefore, using a conventional segmented k-space FGRE pulse sequence, 12–15 breathholds, each with an approximately 16 second duration, are required. This amount of breathholding can be excessive for some patients with heart disease, and may be prohibitive for meeting the timing needs of functional cardiac stress testing.

SUMMARY OF THE INVENTION

The present invention is an improved method for acquiring cardiac phase images and in particular, a method which substantially shortens the scan time for acquiring such images. The method includes the steps of: producing a cardiac signal which indicates the phase of the subject's heart during each cardiac cycle; acquiring one or more segments of k-space NMR data at one or more cardiac phases during each of a succession of cardiac cycles such that the successive segments sample k-space and an image can be reconstructed at the one or more cardiac phases; and wherein each segment is performed as a plurality of echo-planar imaging (EPI) pulse sequences, and a plurality of separately phase encoded NMR echo signals are acquired during each EPI pulse sequence.

A general object of the invention is to shorten the scan time for acquiring NMR cardiac phase images. By acquiring a plurality of NMR echo signals during each pulse sequence of the segment, k-space is sampled at a higher rate. As a result, fewer successive cardiac cycles are required to accumulate sufficient k-space NMR data from which a cardiac image can be reconstructed. A typical scan can be reduced from 16 to 8 or 4 cardiac cycles which is a significant reduction in time that a patient must maintain a breath hold.

BRIEF DESCRIPTION OF THE DRAWINGS

FIG. 3 is a graphic illustration of the acquisition of MR data during a cardiac cycle using the EPI pulse sequence of FIG. 2.

DESCRIPTION OF THE PREFERRED EMBODIMENT

Figure 1:
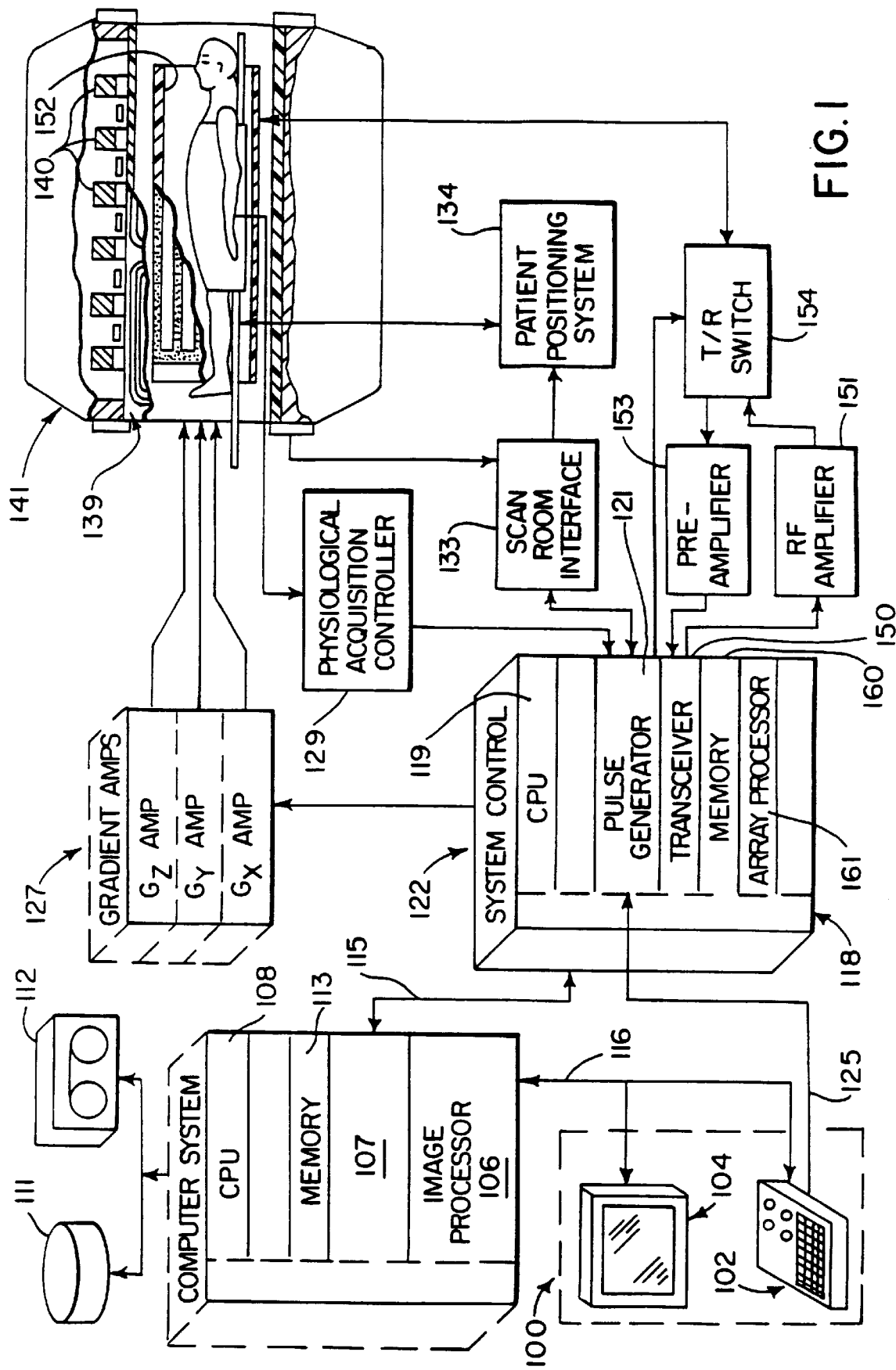
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes attached to the patient. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a surface coil) to be used in either the transmit or receive mode.

The NMR signals picked up by the RF coil 152 are digitized by the transceiver module 150 and transferred to a memory module 160 in the system control 122. When the scan is completed and an array of raw k-space data has been acquired in the memory module 160. As will be described in more detail below, this raw k-space data is rearranged into separate k-space data arrays for each cardiac phase image to be reconstructed, and each of these is input to an array processor 161 which operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104. For a more detailed description of the transceiver 150, reference is made to U.S. Pat. Nos. 4,952,877 and 4,992,736 which are incorporated herein by reference.

Figure 2:
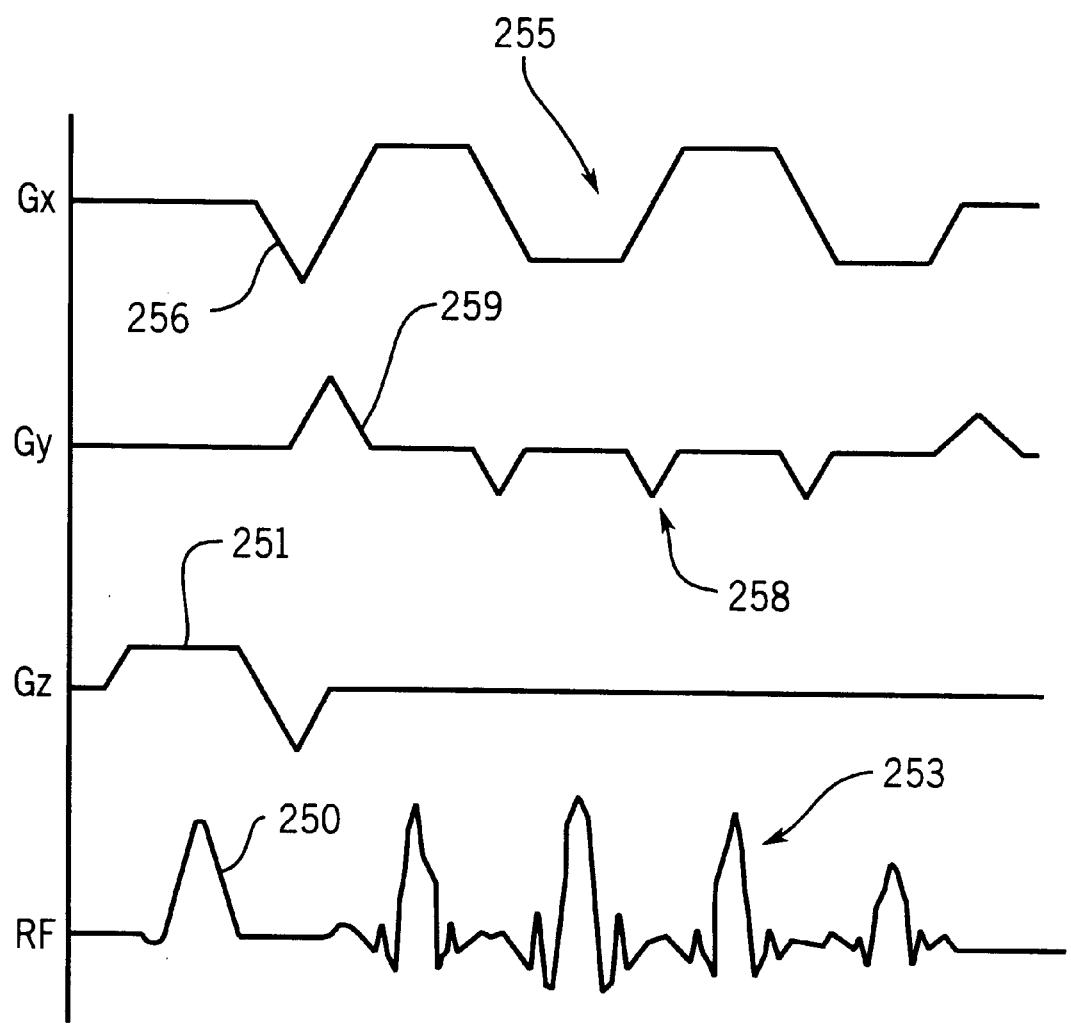
FIG. 2 is a graphic representation of the EPI pulse sequence used in the preferred embodiment of the invention.

The EPI pulse sequence employed in the preferred embodiment of the invention is illustrated in FIG. 2. A 10° RF excitation pulse 250 is applied in the presence of a slice select gradient pulse 251 to produce transverse magnetization in a slice. A total of four separate NMR echo signals, indicated at 253 are acquired during the EPI pulse sequence. Each NMR echo signal 253 is individually phase encoded to sample a line of $k_y$-space in an interleaved manner described in more detail below. While only four NMR echo signals 253 are acquired in the preferred embodiment, up to sixteen NMR echo signals 253 may be acquired in some application.

The NMR echo signals 253 are gradient recalled echoes produced by the application of an oscillating readout gradient 255. The readout sequence is started with a pre-phasing readout gradient lobe 256 and the echo signals 253 are produced as the readout gradient oscillates between positive and negative values. A total of $N_x$ (e.g., $N_x$=128 to 256) samples are taken of each NMR echo signal 253 during each readout gradient pulse 255. The four successive NMR echo signals 253 are separately phase encoded by a series of phase encoding gradient pulses 258. A pre-phasing phase-encoding lobe 259 occurs before the echo signals are acquired to position the first view at the desired location in k-space. Subsequent phase encoding pulses 258 occur as the readout gradient pulses 255 switch polarity, and they step the phase encoding upward through $k_y$-space. To acquire a complete image, this pulse sequence is repeated thirty-two times (i.e. 128/4) and the pre-phasing lobe 259 is changed each time to sample a different part of k-space. With a pulse repetition rate (TR) of 10 msecs., a complete image can be acquired in about 320 milliseconds.

Because the heart is beating, its shape changes substantially over a 320 ms time interval. Therefore, an ECG-gated, segmented k-space data acquisition is performed. In addition, data is acquired throughout the cardiac cycle so that images at different phases of the cardiac cycle may be reconstructed. This acquisition is illustrated in FIG. 3 for a single heart beat.

Referring particularly to FIG. 3, a segment 202 of k-space is repeatedly acquired during the R—R interval between cardiac trigger signals 200. The length of the R—R interval is a function of the patient's heart rate, and in the example shown, ten repetitions of segment $S_1$ are acquired throughout the cardiac cycle, commencing at a preset time interval after the ECG trigger signal 200. Each repetition of segment $S_1$ is an identical sampling of a portion of k-space from the same slice location through the heart. The only difference is that each repetition segment $S_1$ is acquired at a different phase of the cardiac cycle.

Each segment is comprised of four echo planar image shots 204 ($EPI_1$ through $EPI_4$). As described above with reference to FIG. 2, each EPI shot ($EPI_1$ through $EPI_4$) acquires four NMR signals 253 at four different phase encodings to sample four different views ($V_1$ through $V_4$) of k-space. The four views are different in each EPI shot 204 such that a total of 16 different views are acquired during each segment 202.

The acquisition continues for eight successive cardiac cycles. After each cardiac cycle the particular views acquired by each segment 202 are changed such that a total of 128 different views are acquired after eight heart beats. A 128 by 128 pixel image can then be reconstructed to depict the heart at ten different phases of its cardiac cycle. By interpolating as described in U.S. Pat. No. 5,377,680 the number of frames can be doubled to twenty. Typically, the process is repeated 12 to 15 times at different slice locations through the heart to provide sufficient information for an analysis of heart function.

One aspect of the present invention is the order in which the phase encoding views are acquired during the scan. More specifically, k-space is sampled in an interleaved manner, rather than a sequential manner. This is achieved by phase encoding each NMR echo signal 253 to sample ky lines at locations distributed throughout k-space during each shot. The preferred interleaved sampling for the four-echo shot is shown in Table 1.

TABLE 1

| SEGMENT | SHOT | ky line for Echo 1 ($V_1$) | ky line for Echo 2 ($V_2$) | ky line for Echo 4 ($V_3$) | ky line for Echo 4 ($V_4$) |
|---|---|---|---|---|---|
| $S_1$ | 1 | 1 | 19 | 37 | 55 |
| $S_1$ | 2 | 2 | 20 | 38 | 56 |
| $S_1$ | 3 | 3 | 21 | 39 | 57 |
| $S_1$ | 4 | 4 | 22 | 40 | 58 |
| $S_2$ | 5 | 5 | 23 | 41 | 59 |
| $S_2$ | 6 | 6 | 24 | 42 | 60 |
| $S_2$ | 7 | 7 | 25 | 43 | 61 |
| $S_2$ | 8 | 8 | 26 | 44 | 62 |
| $S_3$ | 9 | 9 | 27 | 45 | 63 |
| $S_3$ | 10 | 10 | 28 | 46 | 64 |
| $S_3$ | 11 | 11 | 29 | 47 | 65 |
| $S_3$ | 12 | 12 | 20 | 48 | 66 |
| $S_4$ | 13 | 13 | 31 | 49 | 67 |
| $S_4$ | 14 | 14 | 32 | 50 | 68 |
| $S_4$ | 15 | 15 | 33 | 51 | 69 |
| $S_4$ | 16 | 16 | 34 | 52 | 70 |
| $S_5$ | 17 | 17 | 35 | 53 | 71 |
| $S_5$ | 18 | 18 | 36 | 54 | 72 |

A bottom-up interleaved phase encoding order is shown with 72 $k_y$ lines sampled during the scan. The bottom of k-space is numbered using 1 for the bottom line and 72 for the top line. The sample lines acquired during each shot are distributed evenly throughout k-space, whereas the sampling between successive shots and between successive segments is sequential.

What is claimed is:

1. A method for acquiring a cardiac phase image of a patient's heart using an MRI system, the steps comprising:
    a) producing a cardiac signal which indicates phase of the patient's heart during each cardiac cycle;
    b) acquiring a segment of k-space NMR data at a first cardiac phase during each of a succession of cardiac cycles by performing a plurality of pulse sequences with the MRI system, wherein the acquired segments sample a sufficient portion of k-space that an image may be reconstructed from the acquired NMR data; and
    c) reconstructing a cardiac phase image from the acquired NMR data;
    wherein each pulse sequence is performed by producing transverse magnetization with an RF excitation pulse and acquiring a plurality of separately phase encoded NMR echo signals.

2. The method as recited in claim 1 in which the pulse sequences are echo-planar imaging pulse sequences.

3. The method as recited in claim 1 in which a plurality of cardiac phase images are acquired by repeating step b) at additional cardiac phases during each of the succession of cardiac cycles and repeating step c) with the NMR data acquired at each of the additional cardiac phases.

4. The method as recited in claim 1 in which the phase encodings in each pulse sequence are produced by a phase encoding gradient such that the plurality of acquired NMR echo signals sample at distributed locations throughout k-space.

5. The method as recited in claim 4 in which the successive pulse sequences in each segment sample k-space in sequential order with respect to each other.

6. The method as recited in claim 5 in which the successive segments sample k-space in sequential order with respect to each other.

7. An MRI system for producing a cardiac phase image of a subject's heart, which comprises:

a) a magnet for producing a polarizing magnetic field in the subject;

b) an RF system for producing an RF excitation field in the subject and for receiving NMR signals produced by excited spins in the subject;

c) a magnetic field gradient system for producing a plurality of imaging gradients, including a phase encoding gradient;

d) means coupled to the subject for producing a cardiac signal indicative of the phase of the subject's heart during each cardiac cycle;

e) a pulse generator for receiving the cardiac signal and at a first cardiac phase in each of a plurality of cardiac cycles acquiring a segment of k-space NMR data by directing elements b) and c) to perform a plurality of echo-planar pulse sequences which each acquiring a plurality of NMR signals; and f) a processor for reconstructing an image from the acquired segments of k-space NMR data that depicts the subject's heart at the first cardiac phase.

8. The MRI system as recited in claim 7 in which the pulse generator directs elements b) and c) to acquire segments of NMR data at additional cardiac phases and the processor reconstructs corresponding additional images from the acquired k-space NMR data depicting the subject's heart at corresponding additional cardiac phases.

9. The MRI system as recited in claim 7 in which the magnetic field gradient system is operated by the pulse generator to produce phase encoding during each pulse sequence such that k-space is sampled at distributed locations throughout k-space.

10. The MRI system as recited in claim 9 in which the magnetic field gradient system is operated to produce phase encodings in successive pulse sequences in each segment to sample k-space in sequential order with respect to each other.

11. The MRI system as recited in claim 10 in which the magnetic field gradient system is operated to produce phase encodings in successive segments to sample k-space in sequential order with respect to each other.

* * * * *